United States Patent
Nishizawa et al.

(10) Patent No.: US 6,875,631 B2
(45) Date of Patent: Apr. 5, 2005

(54) SEMICONDUCTOR DEVICE AND A METHOD OF MANUFACTURING THE SAME

(75) Inventors: Hirotaka Nishizawa, Fuchu (JP); Hideki Tanaka, Sagamihara (JP); Yuichiro Yamada, Kawasaki (JP); Tomoaki Kudaishi, Kodaira (JP); Akira Katsumata, Tokyo (JP)

(73) Assignees: Renesas Technology Corp., Tokyo (JP); Hitachi ULSI Systems Co., Ltd., Tokyo (JP); Sanwa Denki Kogyo Co., Ltd., Tokyo (JP)

(*) Notice: Subject to any disclaimer, the term of this patent is extended or adjusted under 35 U.S.C. 154(b) by 223 days.

(21) Appl. No.: 10/360,712

(22) Filed: Feb. 10, 2003

(65) Prior Publication Data

US 2003/0115748 A1 Jun. 26, 2003

Related U.S. Application Data

(62) Division of application No. 10/240,111, filed as application No. PCT/JP00/02126 on Mar. 31, 2000, now Pat. No. 6,759,754.

(51) Int. Cl.⁷ .................. H01L 23/12; H01L 23/495; H01L 21/00; H01L 21/44; B23Q 3/00; H05K 3/30; H05K 1/14

(52) U.S. Cl. .................. 438/106; 257/704; 257/710; 257/666; 438/64; 438/111; 438/123; 438/125; 29/465; 29/740; 29/832; 361/737

(58) Field of Search .................. 257/704, 710, 257/666; 438/125, 123, 111, 106, 64; 29/832, 740, 465; 361/737

(56) References Cited

U.S. PATENT DOCUMENTS 4,852,736 A * 8/1989 Kojima et al. .............. 235/1 D
5,250,845 A   10/1993 Runyan
5,493,477 A * 2/1996 Hirai ........................ 361/737
5,778,520 A * 7/1998 Kim et al. ................... 29/827
5,879,170 A * 3/1999 Nogami ..................... 439/76.1
5,886,402 A * 3/1999 Onoda et al. ............... 257/679
5,994,769 A * 11/1999 Onoda et al. ............... 257/679
6,160,711 A * 12/2000 Gerrits et al. ............... 361/737
6,188,307 B1 * 2/2001 Katsuki et al. ............ 338/22 R
6,256,873 B1 * 7/2001 Tiffany, III ................ 29/827
6,269,537 B1 * 8/2001 Kimura et al. ............... 29/832
2002/0012829 A1 * 1/2002 Yamahira et al. ............ 429/56

FOREIGN PATENT DOCUMENTS

| JP | 357053951 | * 3/1982 |
| JP | 63-140600 | * 6/1988 |
| JP | 404246847 | * 9/1992 |
| JP | 4-299853 |   10/1992 |

* cited by examiner

Primary Examiner—Kamand Cuneo
Assistant Examiner—James M. Mitchell
(74) Attorney, Agent, or Firm—Mattingly, Stanger, Malur & Brundidge, P.C.

(57) ABSTRACT

A CF card (1) comprises: a casing constituted by two panel plates (2, 2) and a frame (3); and a printed wiring board (4) accommodated in the casing. A plurality of claw-like engaging parts (5) are provided to the peripheries of the panel plates (2). When the CF card (1) is assembled, the engaging parts (5) of the first panel plate (2) are inserted into through holes of a long groove (8) provided in the frame (3) and then the printed wiring board (4) is mounted on the panel plate (2) located at the inside of the frame (3). Thereafter, the engaging parts (5) of the second panel plate (2) are inserted into the through holes of the long groove (8) from the surface located in the opposite side of the frame (3). There are two types of engaging parts (5): one having lances and the other having holes. Inside the through holes, the lances of the engaging parts (5) of one panel plate (2) are inserted into the holes of the engaging parts (5) of the other panel plate (2).

4 Claims, 18 Drawing Sheets

ENLARGED VIEW OF ENGAGING PART

SEMICONDUCTOR DEVICE AND A METHOD OF MANUFACTURING THE SAME

This is a divisional application of U.S. Ser. No. 10/240,111, filed Sep. 27, 2002 now U.S. Pat. No. 6,759,754, which is a 371 of PCT/JP00/02126, filed Mar. 31, 2000.

TECHNICAL FIELD OF THE INVENTION

The present invention relates to a semiconductor device and a method of manufacturing the same, and, more particularly, to a technique effectively applied to a memory card.

BACKGROUND OF THE INVENTION

A memory card is a card-type semiconductor device mounting a semiconductor chip in which a memory LSI for data storage or program storage is formed, and is connected to various kinds of electronic equipments such as a digital camera, a handheld PC, an audio recorder and the like when in use.

The memory card belonging to these kinds has a structure in which a printed wiring board on which the above-mentioned semiconductor chip is mounted is accommodated in a casing (case). However, from a security standpoint, it is required that the casing has such a rigid structure as not to be easily disassembled.

Meanwhile, in the case of a memory card for data storage in particular, the low cost thereof is required as one high priority. Therefore, the reduction in the manufacturing cost must be achieved by reducing the number of components of the casing to the utmost and by promoting the automation of assembly thereof.

However, the conventional memory card has had problems of the fact that equipment investment for the assembly thereof becomes expensive and the manufacturing cost is difficult to reduce in order to require a special apparatus such as an ultrasonic welding machine or the like in the assembly thereof.

An object of the present invention is to provide a memory card having high reliability by low manufacturing cost.

The above and other objects and novel characteristics of the present invention will be apparent from the description of this specification and the accompanying drawings.

SUMMARY OF THE INVENTION

The typical ones of the inventions disclosed in the present application will be briefly described as follows.

A semiconductor device according to the present invention comprises a casing constituted by a frame having a plurality of through holes penetrating through both surfaces thereof, a first panel plate attached to one surface of said frame, and a second panel plate attached to the other surface of said frame, a printed wiring board on which a semiconductor chip is mounted being accommodated in said casing, wherein a plurality of engaging parts each having a lance or a hole are formed on the peripheries of said first and second panel plates, respectively, and said engaging parts formed on said first panel plate and said engaging parts formed on said second panel plate are inserted into said plurality of through holes formed in said frame, and said lance provided in each of one plurality of engaging parts is inserted into said hole provided in each of the other plurality of engaging parts.

A method of manufacturing a semiconductor device according to the present invention comprises the steps of:

(a) preparing a frame having a plurality of through holes penetrating through both surfaces thereof, and first and second panel plates in which a plurality of engaging parts each provided with a lance or a hole in the peripheries thereof is respectively formed, and a printed wiring board on which a semiconductor chip is mounted;

(b) pressing said engaging parts formed on said first panel plate into said through holes formed in said frame, thereby attaching said first panel plate to one surface of said frame;

(c) mounting said printed wiring board to said frame to which said first panel plate is attached; and (d) after said step (c), pressing said engaging parts formed on said second panel plate, into said through holes formed in said frame, and inserting said lance each provided in one of said engaging parts formed on said first panel plate and said engaging parts formed on said second panel plate, into said hole each provided in the others, thereby attaching said second panel plate to the other surface of said frame.

DESCRIPTION OF THE PREFERRED EMBODIMENTS

In the following, embodiments of the present invention will be described in detail with reference to the accompanying drawings. Components having the same function are denoted by the same reference symbols through all the drawings for describing the embodiments, and the repetitive description thereof will be omitted.

Figure 1A:
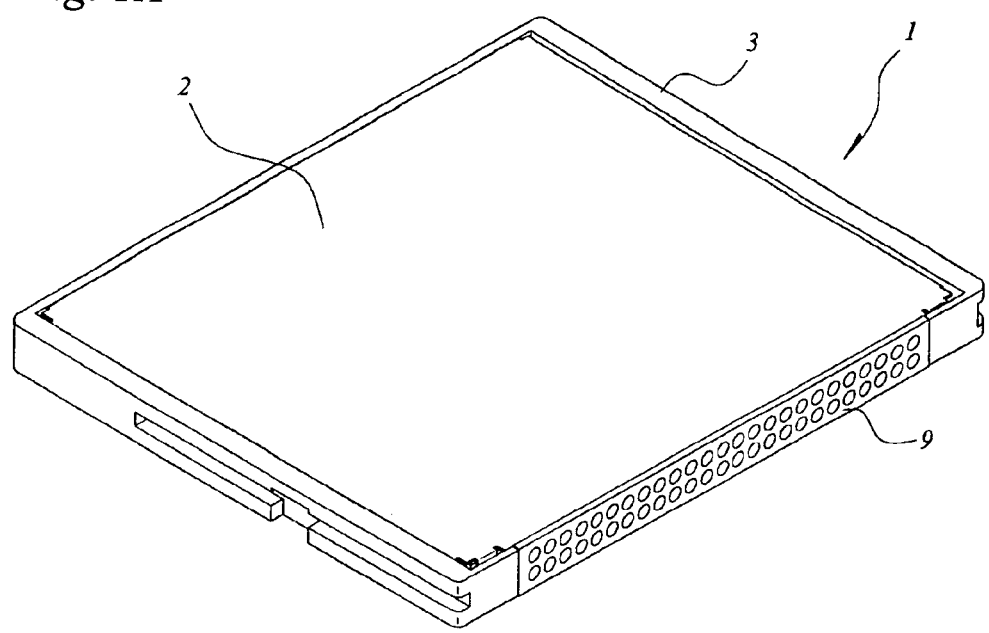
FIG. 1A is a perspective view showing the appearance of a semiconductor device that is an embodiment of the present invention.
Figure 1B:
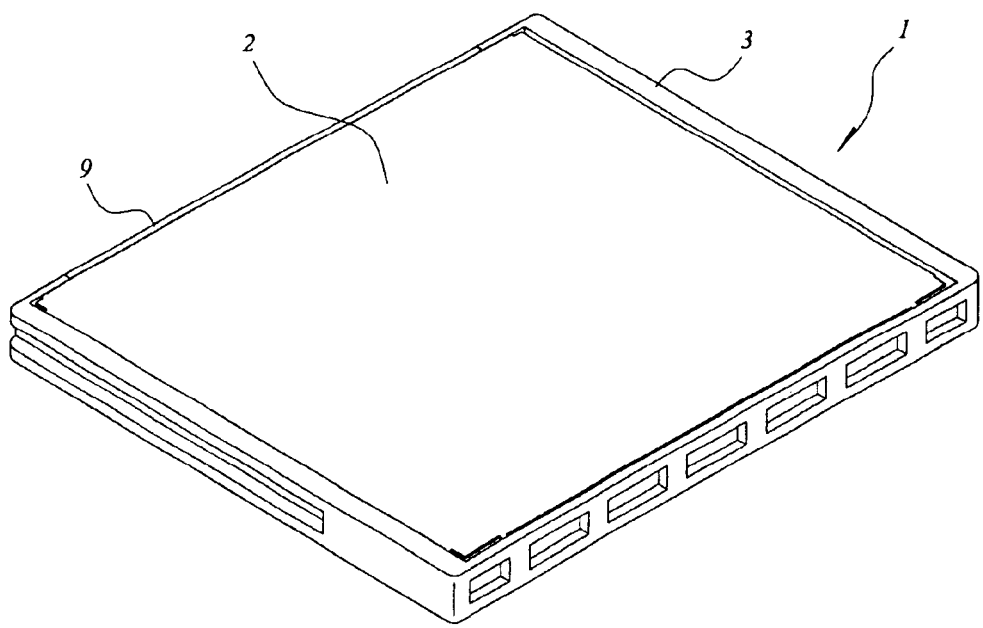
FIG. 1B is a perspective view showing the appearance of a semiconductor device that is an embodiment of the present invention.
Figure 2:
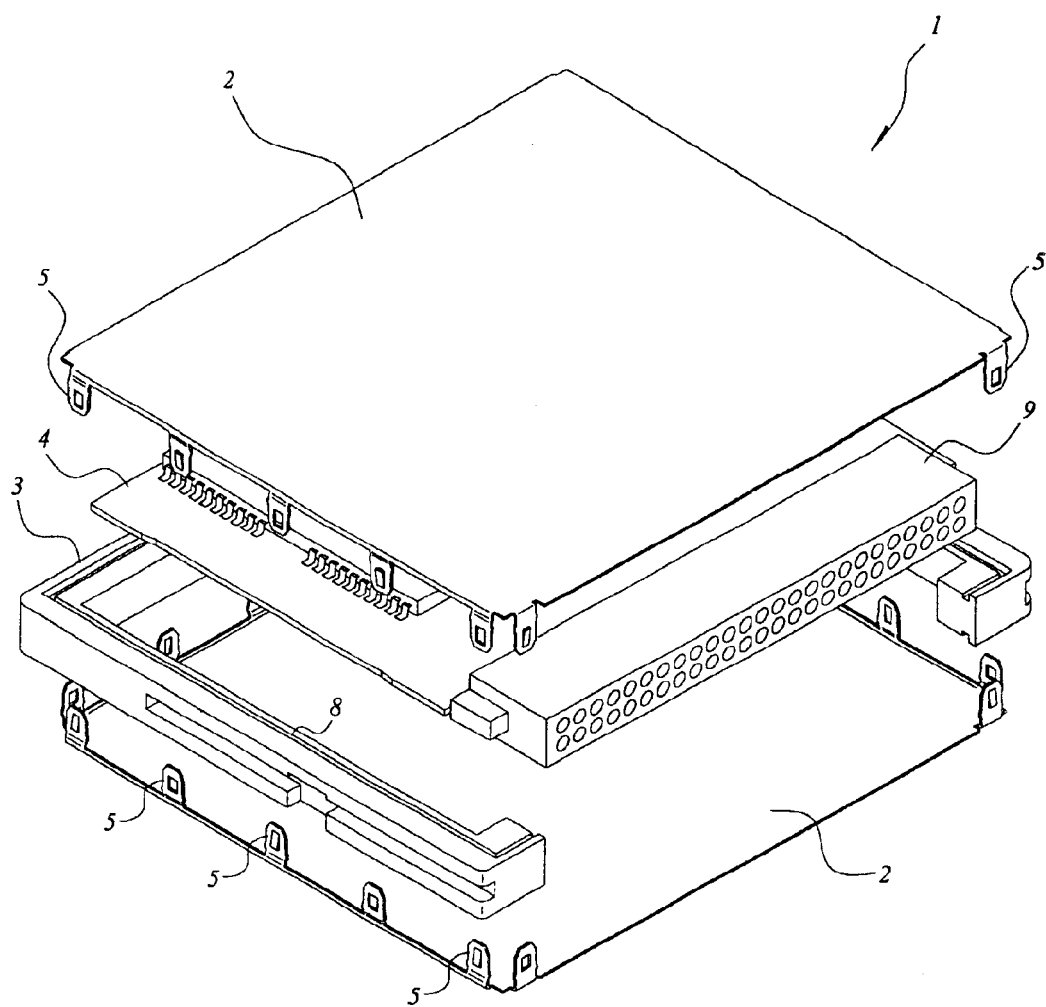
FIG. 2 is an exploded perspective view of a semiconductor device that is an embodiment of the present invention.

A semiconductor device in this embodiment is a Compact Flash (registered trademark of SanDisk Corporation in U.S.A.) Card (hereinafter, referred to as a CF card simply), which meets CFA (Compact Flash Association) standards. FIGS. 1A and 1B are perspective views showing the appearance of a CF card type I, wherein FIG. 1A is a view shown with a connector 9 located in a front side and FIG. 1B is a view shown on the condition that a side opposite to the connector 9 is located in a front side. In addition, FIG. 2 is an exploded perspective view of the CF card.

As shown in the drawings, the components of the CF card 1 are: a casing constituted by two panel plates 2 and 2 and a frame 3; and a printed wiring board 4 accommodated in this casing. Outer dimensions of the casing are length× width=36.4 mm×42.8 mm and height=3.3 mm.

Figure 3:
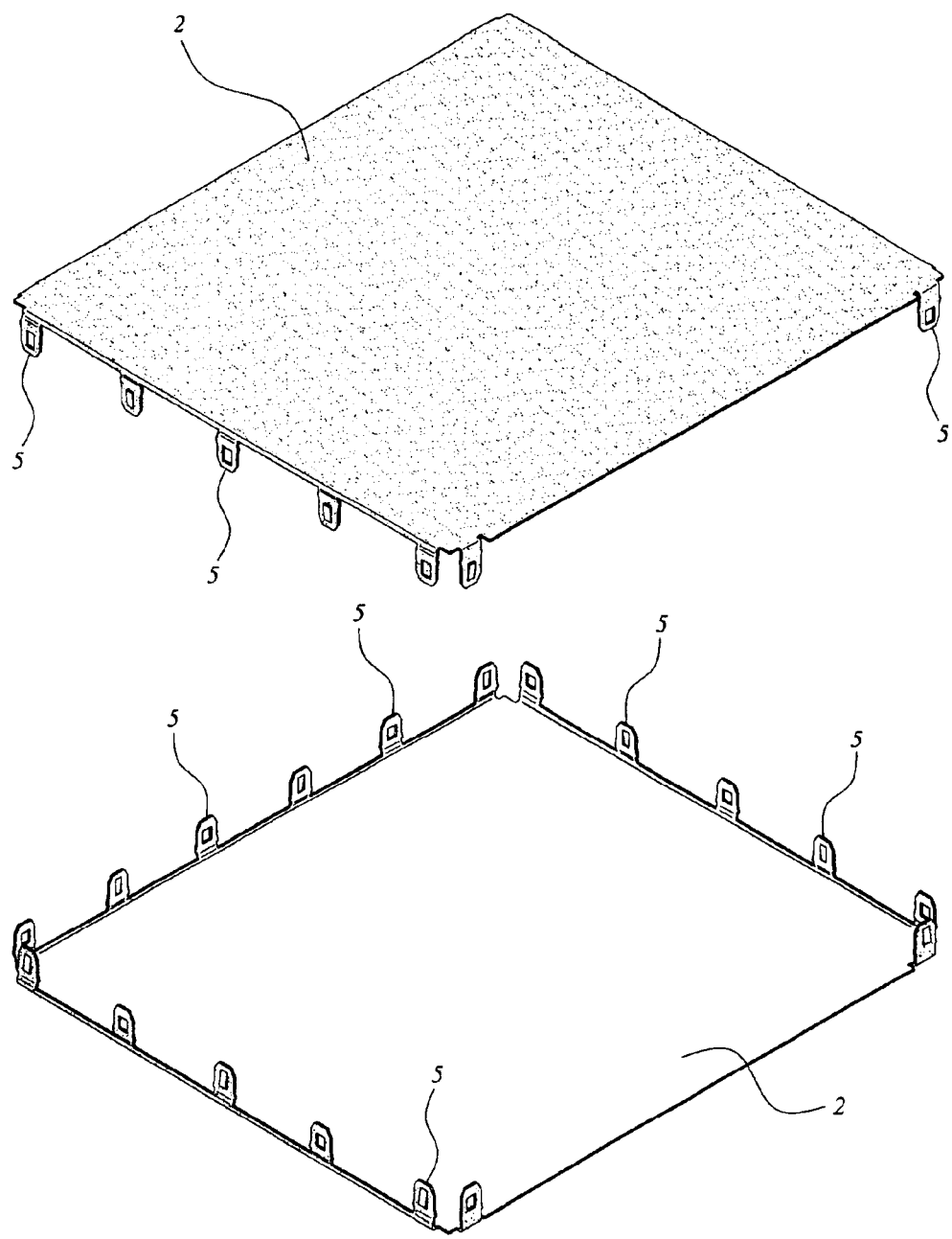
FIG. 3 is a perspective view showing a panel plate of a semiconductor device that is an embodiment of the present invention.

FIG. 3 is a perspective view of the two panel plates 2 and 2. These panel plates 2 and 2 are composed of thin plates made of stainless steel (SUS 304) and each having the same shape. An embossing treatment is performed to the surface side of each panel plate 2, and so fingerprints or the like are not easily attached thereto. Also, a plurality of claw-like engaging parts 5 are provided on the periphery of each panel plate 2.

Respective engaging parts 5 are integrally formed on each panel plate 2. Although not particularly limited, five engaging parts 5 are provided in each of both sides thereof and one engaging part 5 is provided in each of both ends of the connector 9 side and six engaging parts 5 are provided in a side opposite thereto. Thus, a total of eighteen engaging parts 5 are provided. Each of the engaging parts 5 has tensile strength enough to bear a load of 1 Kgf or more.

Figure 4:
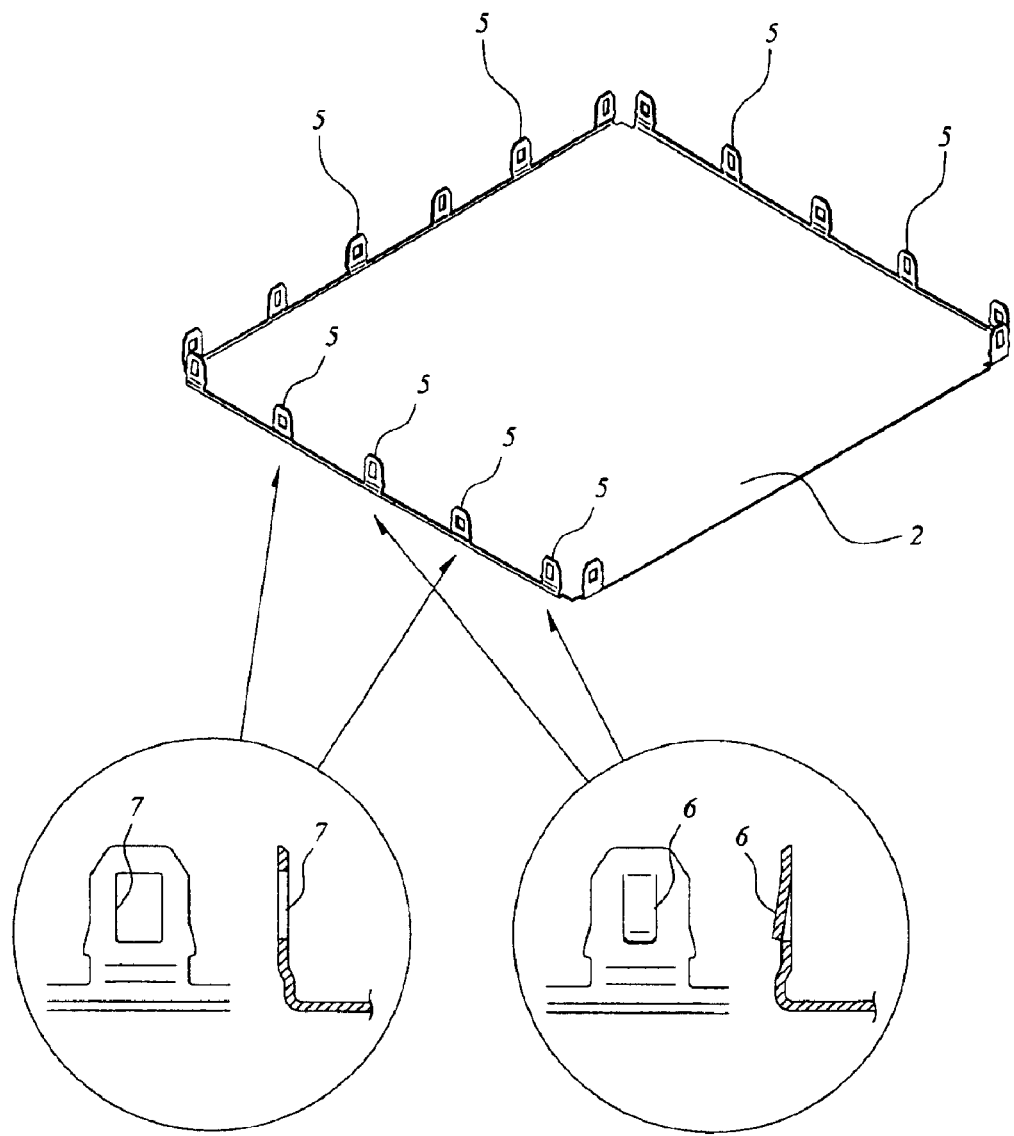
FIG. 4 is an enlarged view of an engaging part provided on a panel plate of a semiconductor device that is an embodiment of the present invention.

As shown in the enlarged view of FIG. 4, there are two types of engaging parts 5, that is, one having a lance 6 and the other having a hole 7. The engaging parts 5 each having the lance 6 and the engaging parts 5 each having the hole 7 are alternately arranged along the peripheries of the respective panel plates 2 and 2. As described later, in the assembly of the CF card 1, each lance 6 of the engaging parts 5 on one panel plate 2 is inserted into each hole 7 of the engaging parts 5 on the other panel plate 2.

Figure 5:
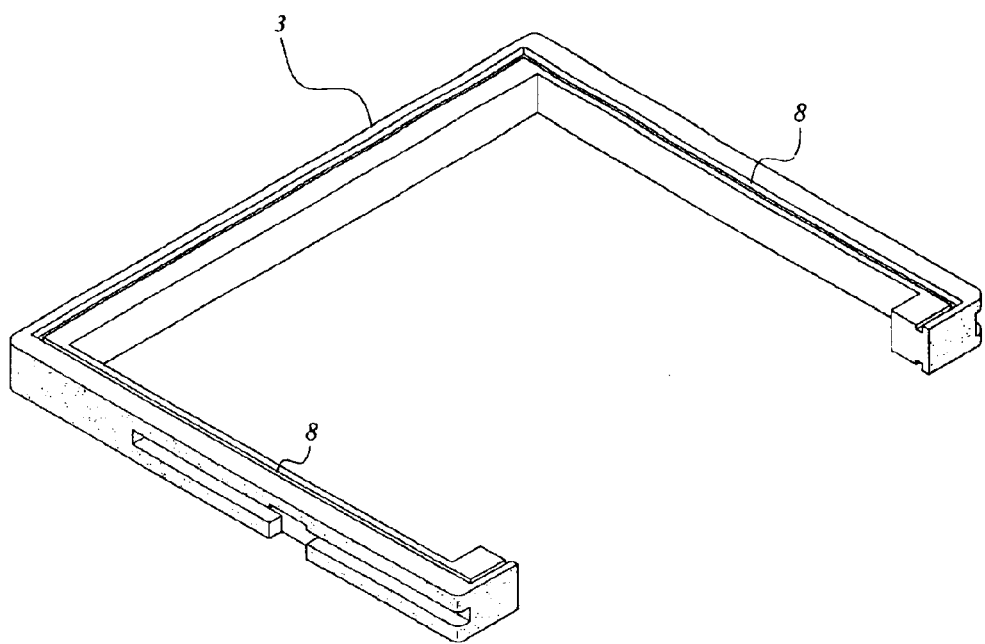
FIG. 5 is a perspective view showing a frame of a semiconductor device that is an embodiment of the present invention.
Figure 6:
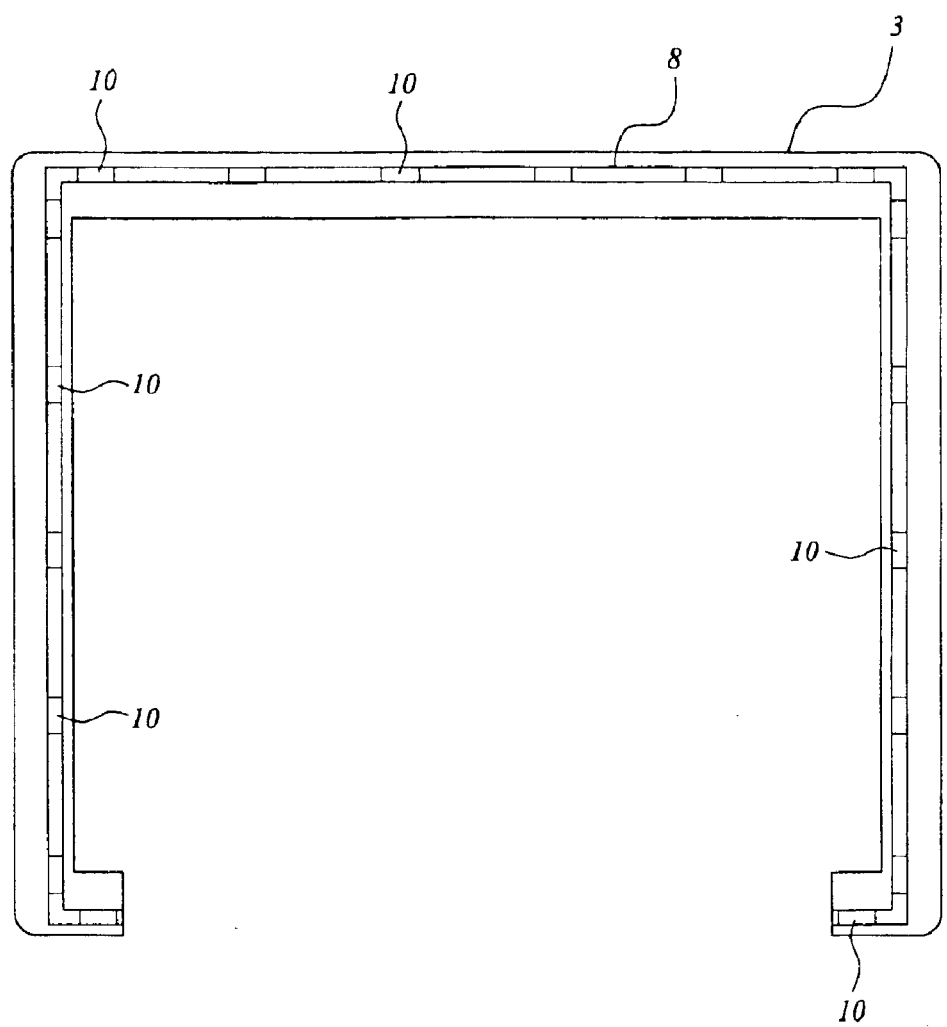
FIG. 6 is a plan view showing a frame of a semiconductor device that is an embodiment of the present invention.

FIG. 5 is a perspective view of the frame 3, and FIG. 6 is a plan view of the same. The frame 3 has an outline formed in an approximate U-shape, and is constituted by integrally molding a resin having good moldability, for example, PBT (Polybutylene telephthalate) containing 15% of glass fiber, or the like. Also, an embossing treatment is performed to the outer surface of the frame 3, such that fingerprints or the like are not easily attached thereto and sinks caused due to the injection molding thereof are made inconspicuous.

A long groove 8 to which the periphery of each panel plate 2 is fitted is provided in each of the upper and lower surfaces of the frame 3. Further, through holes 10 into which the engaging parts 5 of each panel plate 2 are inserted are provided in the long groove 8.

Figure 7:
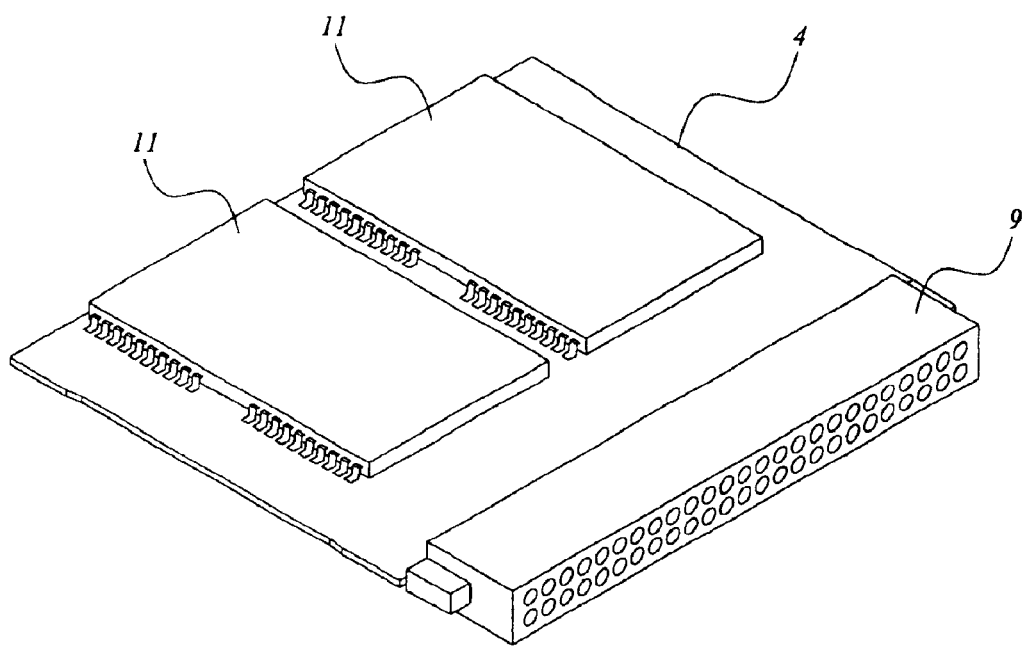
FIG. 7 is a perspective view showing a printed wiring board of a semiconductor device that is an embodiment of the present invention.

FIG. 7 is a perspective view of the printed wiring board 4. The printed wiring board 4 is constituted by forming Cu wirings (not shown) on the surface of, for example, a plate made of epoxy resin containing glass fiber (glass epoxy), and packages 11 are mounted on the main surface thereof. In each package 11, a semiconductor chip (not shown) in which a flash memory for data storage is formed is sealed. Further, the connector 9 for connecting the CF card 1 to various electronic equipments such as a digital camera, a handheld PC, an audio recorder and the like is attached to one side of the printed wiring board 4. In the case of the CF card type I, the interface of the connector 9 has fifty pins.

As described above, in the CF card 1 according to this embodiment, the casing for accommodating the printed wiring board 4 is constituted by an extremely small number of components, that is, two panel plates 2 and 2 each having the same shape and one frame 3.

Next, an assembly method of the CF card 1 constituted in the above-described manner will be described with reference to FIGS. 8 to 20.

Figure 8:
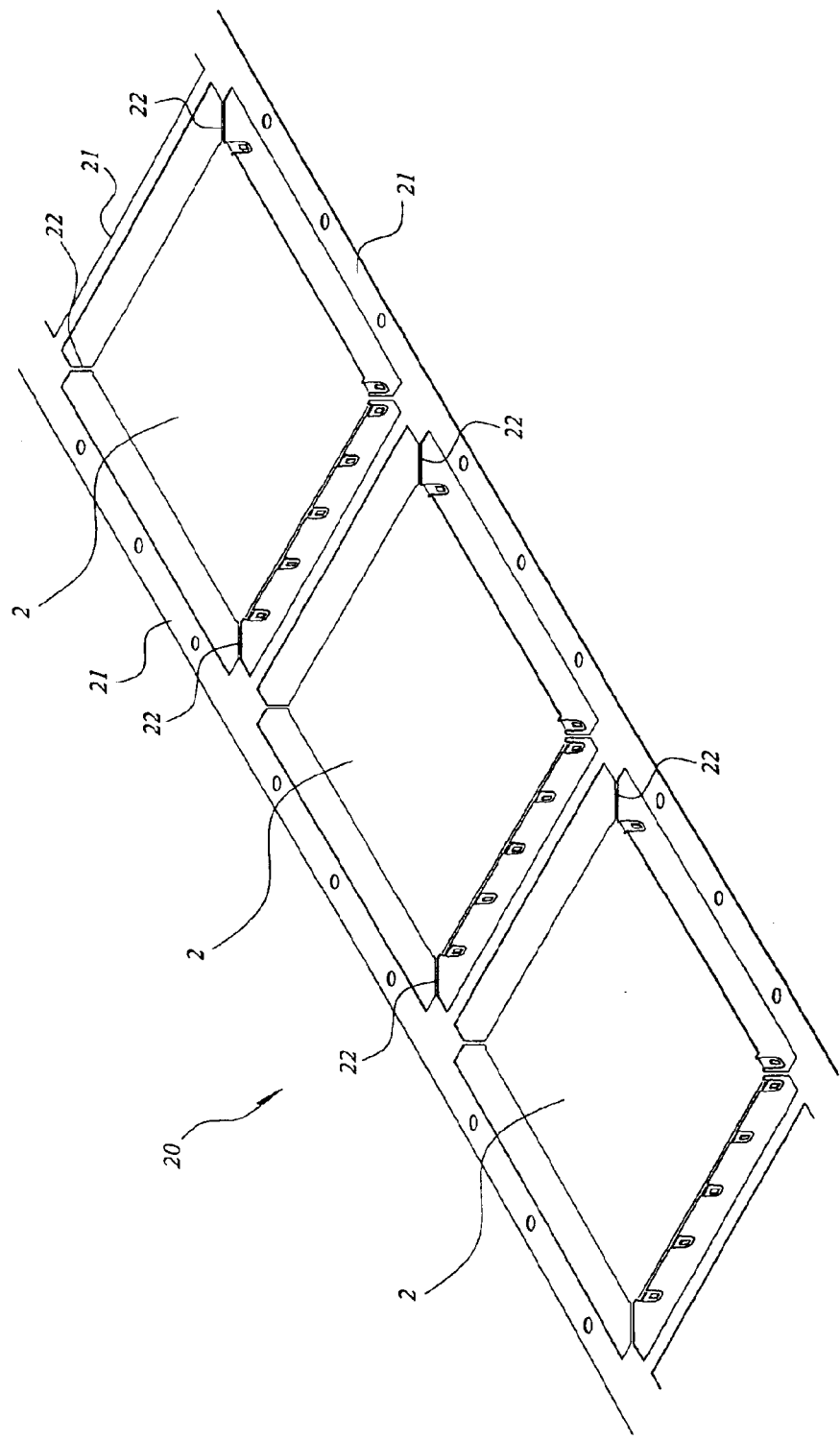
FIG. 8 is a perspective view illustrating a method of manufacturing a semiconductor device that is an embodiment of the present invention.

FIG. 8 is a perspective view showing a part of a hoop material 20 having a multiple series of panel plates 2. Each of the panel plates 2 is supported by carriers 21 via notches 22 provided at the four corners thereof. In the drawings, almost three panel plates 2 are illustrated. However, since the hoop material 20 has actually a multiple series of about one thousand panel plates 2, it is wound on a reel or the like and is stored in this state.

Figure 9:
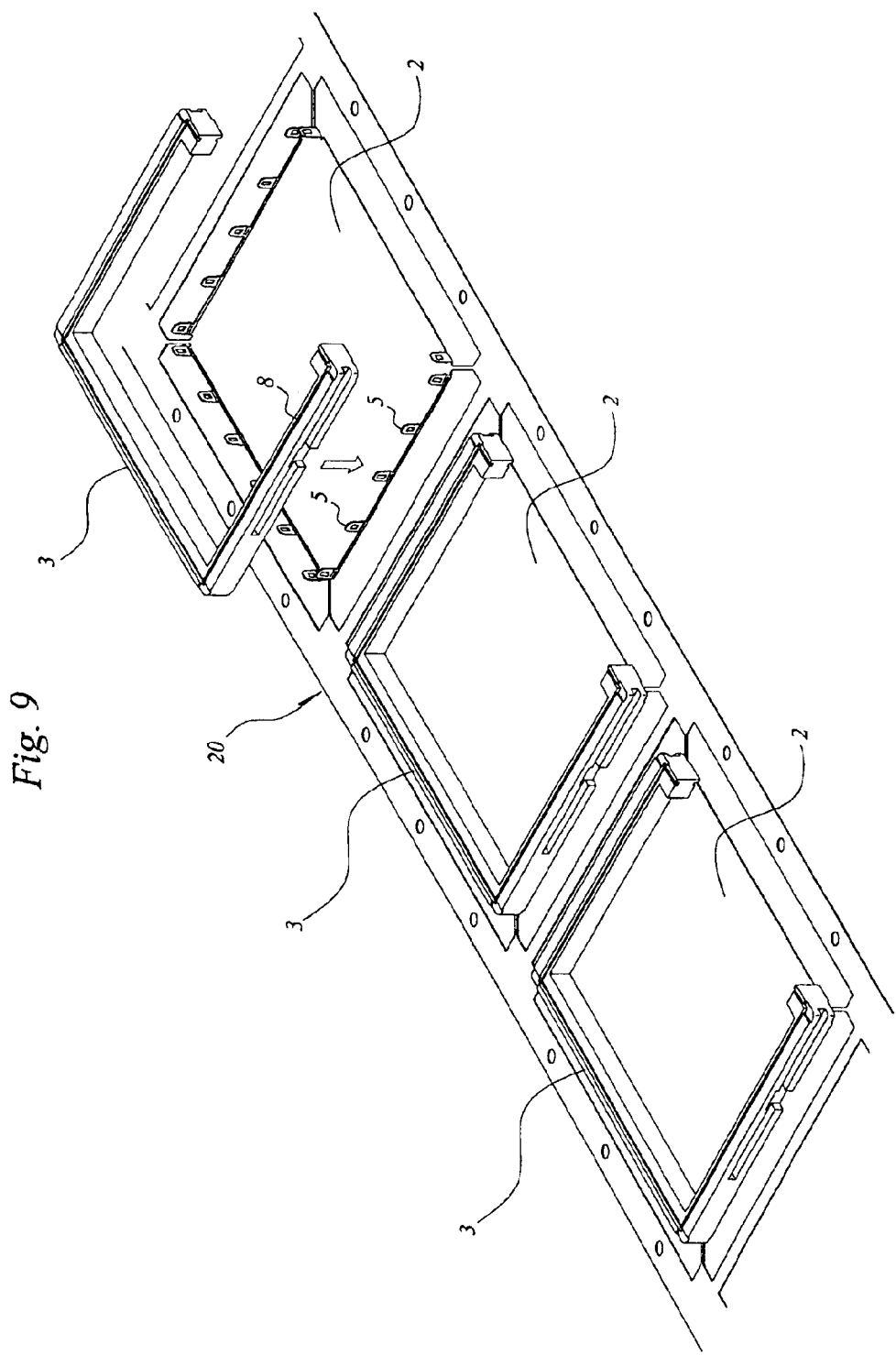
FIG. 9 is a perspective view illustrating a method of manufacturing a semiconductor device that is an embodiment of the present invention.
Figure 10:
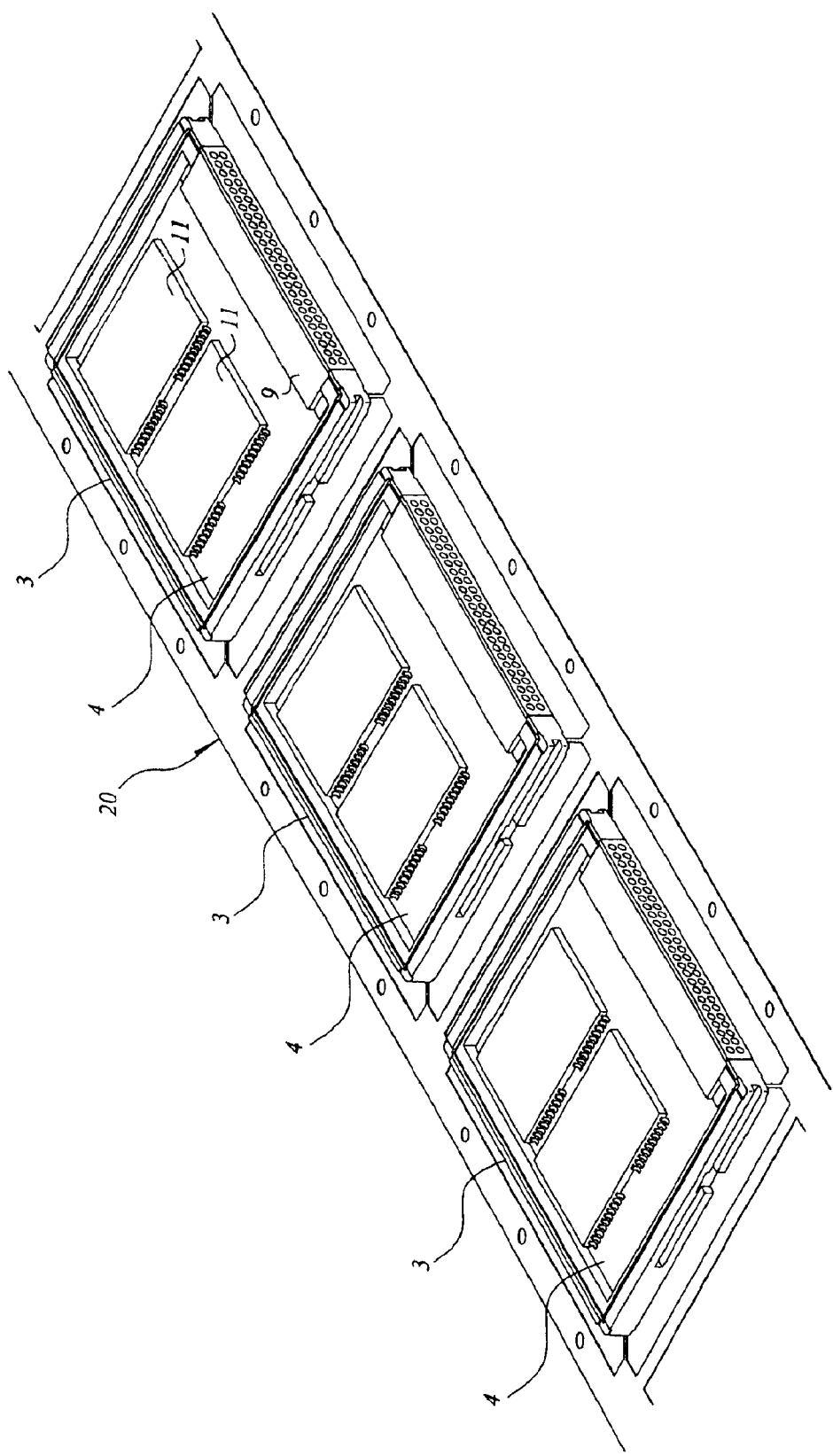
FIG. 10 is a perspective view illustrating a method of manufacturing a semiconductor device that is an embodiment of the present invention.
Figure 11:
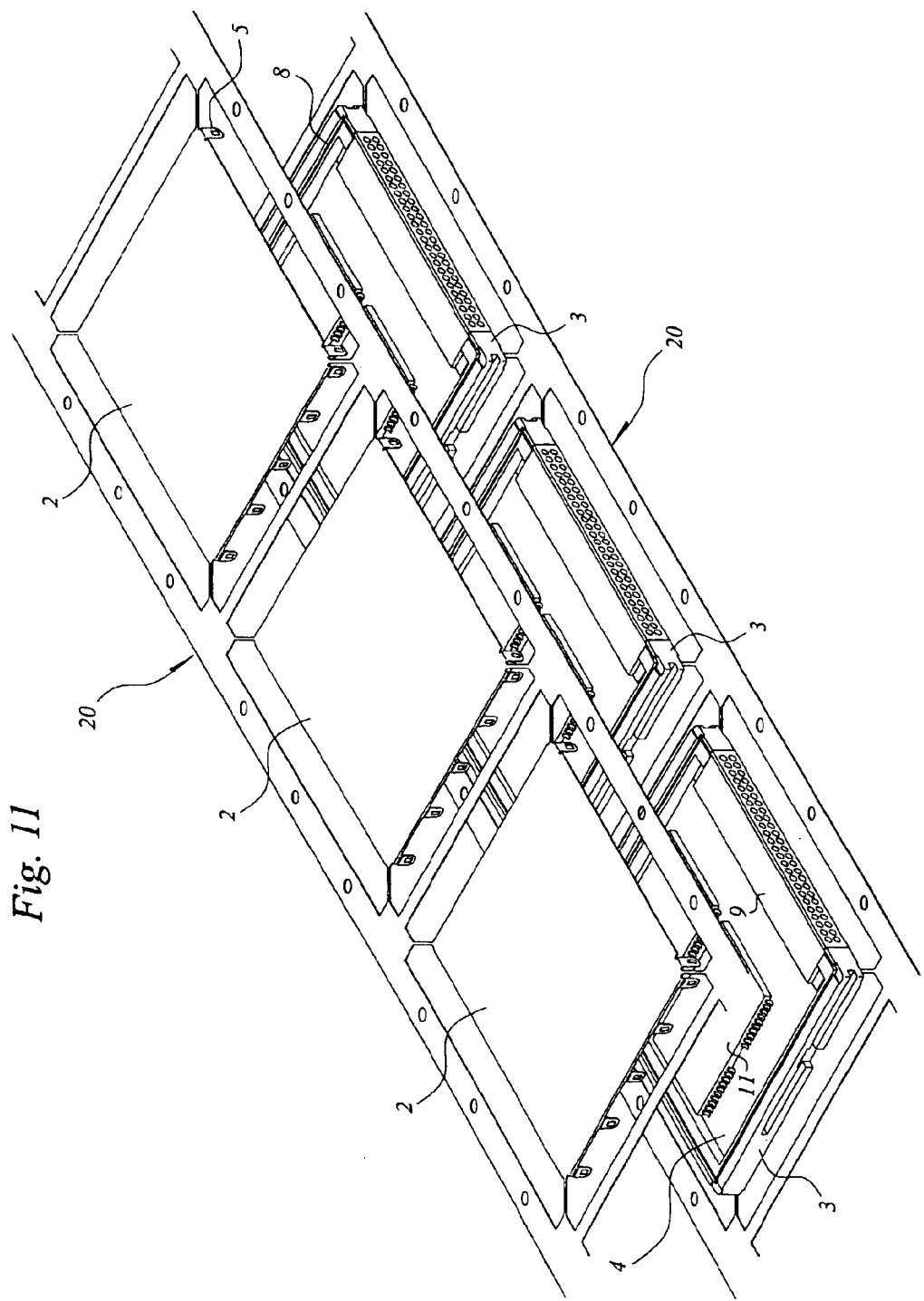
FIG. 11 is a perspective view illustrating a method of manufacturing a semiconductor device that is an embodiment of the present invention.

The CF card 1 is assembled, for example, by: inserting the engaging parts 5 of each panel plate 2, into the through holes 10 (see FIG. 6) formed in the long groove 8 provided in the frame 3 as shown in FIG. 9; then mounting the printed wiring board 4 on the panel plate 2 located at the inside of each frame 3 as shown in FIG. 10; and thereafter inserting the engaging parts 5 of the panel plate 2 located in a second hoop material 20, into the through holes 10 formed in the long groove 8 from the surface of a opposite side of the frame 3 as shown in FIG. 11.

Figure 12:
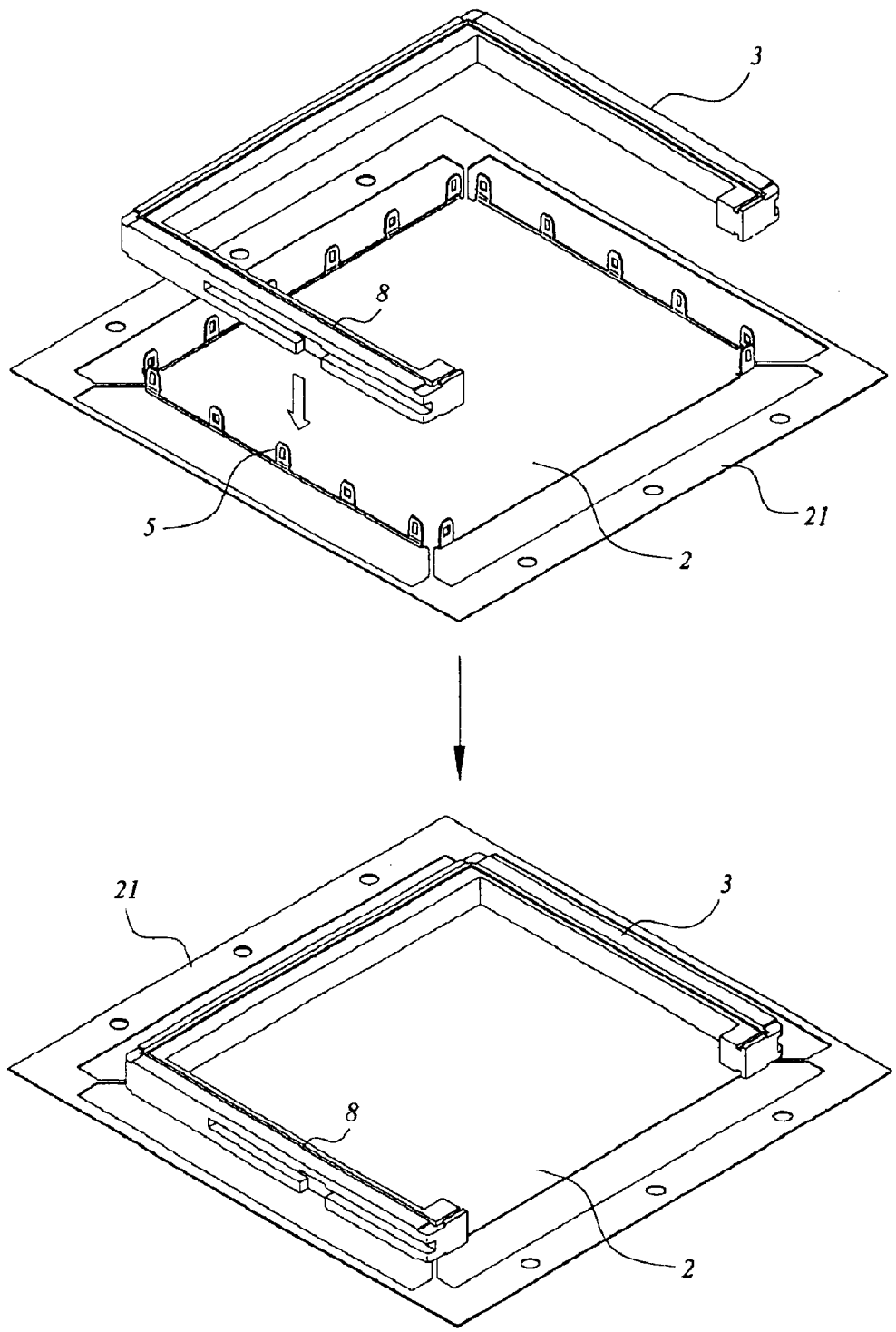
FIG. 12 is a perspective view illustrating a method of manufacturing a semiconductor device that is an embodiment of the present invention.

As shown in FIG. 12, attachment of the panel plate 2 to the frame 3 can also be made after the plate 2 is separated from the hoop material 20. As a jig for attaching the panel plate 2 to the frame 3, for example, as shown in FIG. 13, the jig can also be used which has a receiving table 32 provided with four walls 31 and restricting the position of the frame 3, and a punch 33 having an area almost equal to that of the panel plate 2.

In this case, the frame 3 is firstly positioned at each inside of the walls 31 of the receiving table 32, and thereafter the engaging parts 5 of the separated panel plate 2 are pressed into the through holes 10 of the frame 3 by using the punch 33. At this time, since the pressed load is 1 Kg or less per engaging part 5, each engaging part 5 can be easily pressed thereinto.

Figure 14:
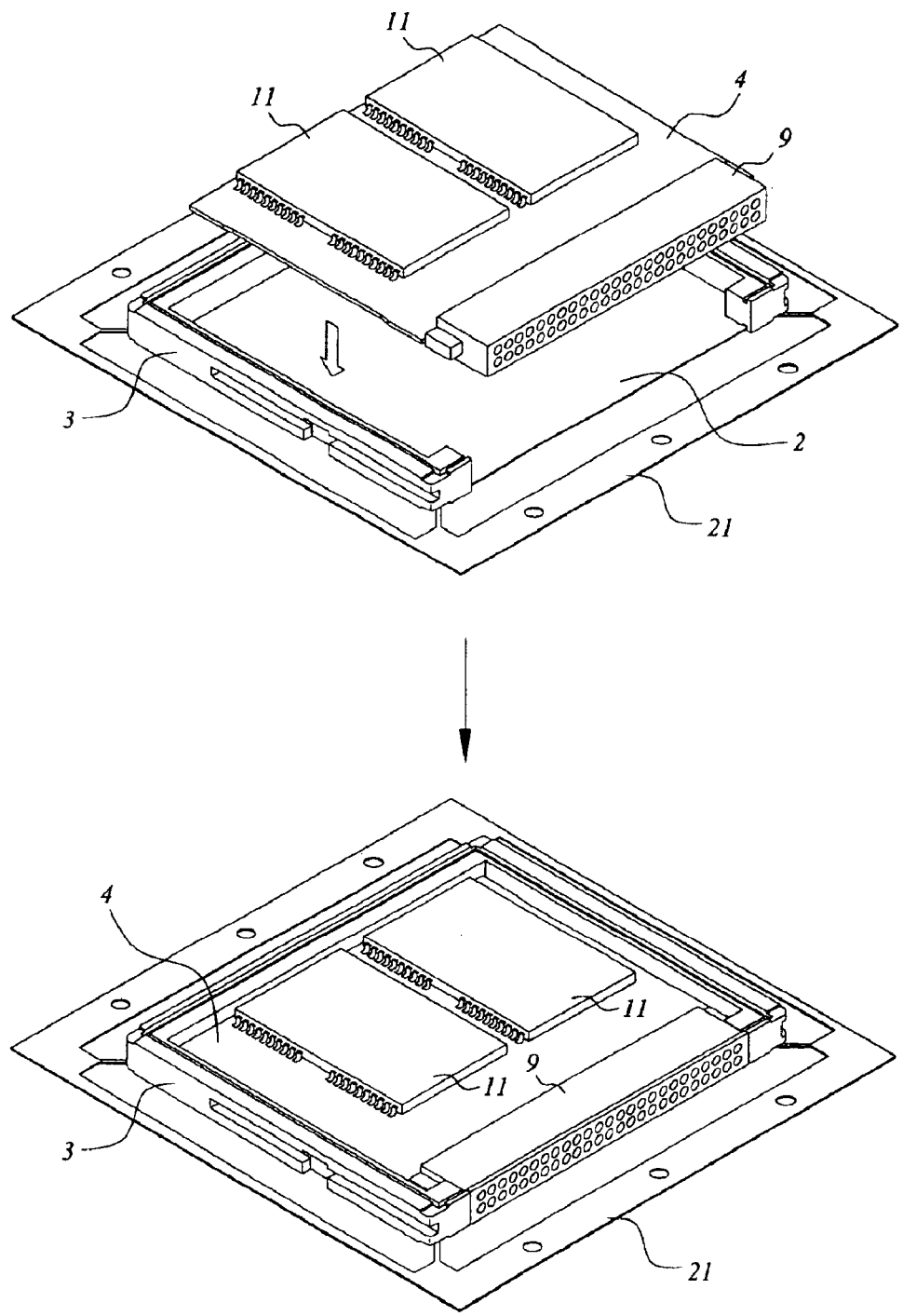
FIG. 14 is a perspective view illustrating a method of manufacturing a semiconductor device that is an embodiment of the present invention.
Figure 15:
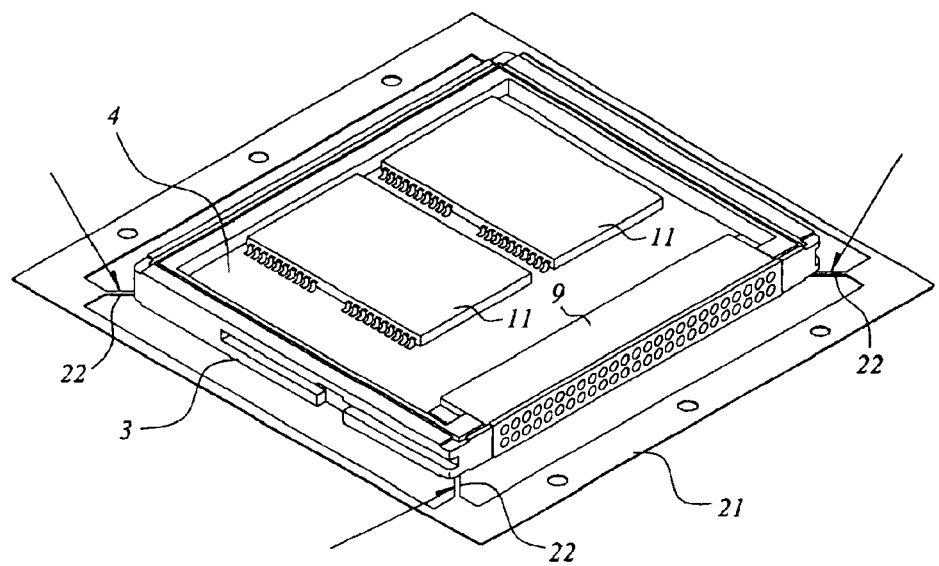
FIG. 15 is a perspective view illustrating a method of manufacturing a semiconductor device that is an embodiment of the present invention.
Figure 16:
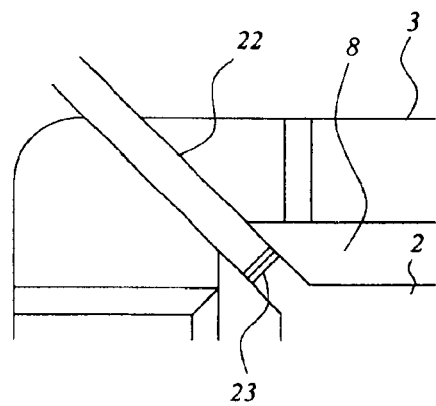
FIG. 16 is a plan view illustrating a method of manufacturing a semiconductor device that is an embodiment of the present invention.
Figure 17A:
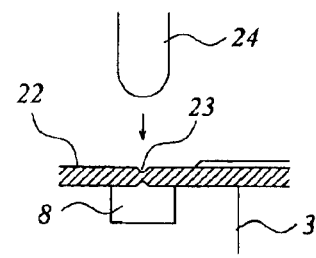
FIG. 17A is a cross-sectional view illustrating a method of manufacturing a semiconductor device that is an embodiment of the present invention.
Figure 17B:
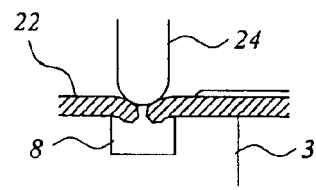
FIG. 17B is a cross-sectional view illustrating a method of manufacturing a semiconductor device that is an embodiment of the present invention.

Next, as shown in FIG. 14, the printed wiring board 4 is mounted on the panel plate 2 attached to the frame 3. Thereafter, the four notches 22 connecting the panel plate 2 and the carrier 21 are cut out as shown in FIG. 15. In this case, for example, by providing a halfcut 23 in a part of each notch 22 in advance as shown in FIG. 16 and by pushing each notch 22 with using a eyeleteer 24 or the like to drop the notch into the long groove 8 of the frame 3 as shown in FIGS. 17A and 17B, the notches 22 can be easily cut out.

Figure 13:
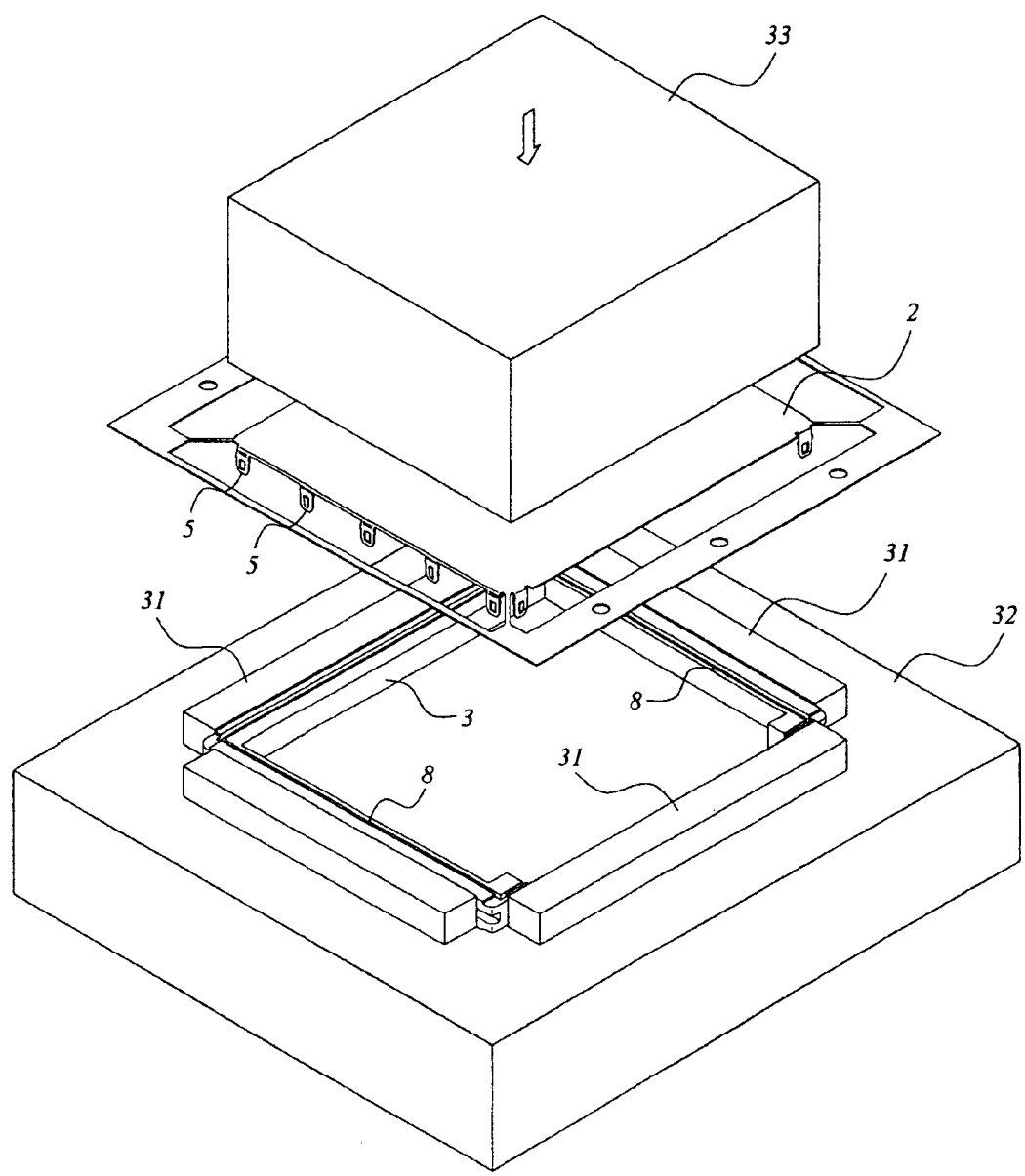
FIG. 13 is a perspective view illustrating a method of manufacturing a semiconductor device that is an embodiment of the present invention.
Figure 18:
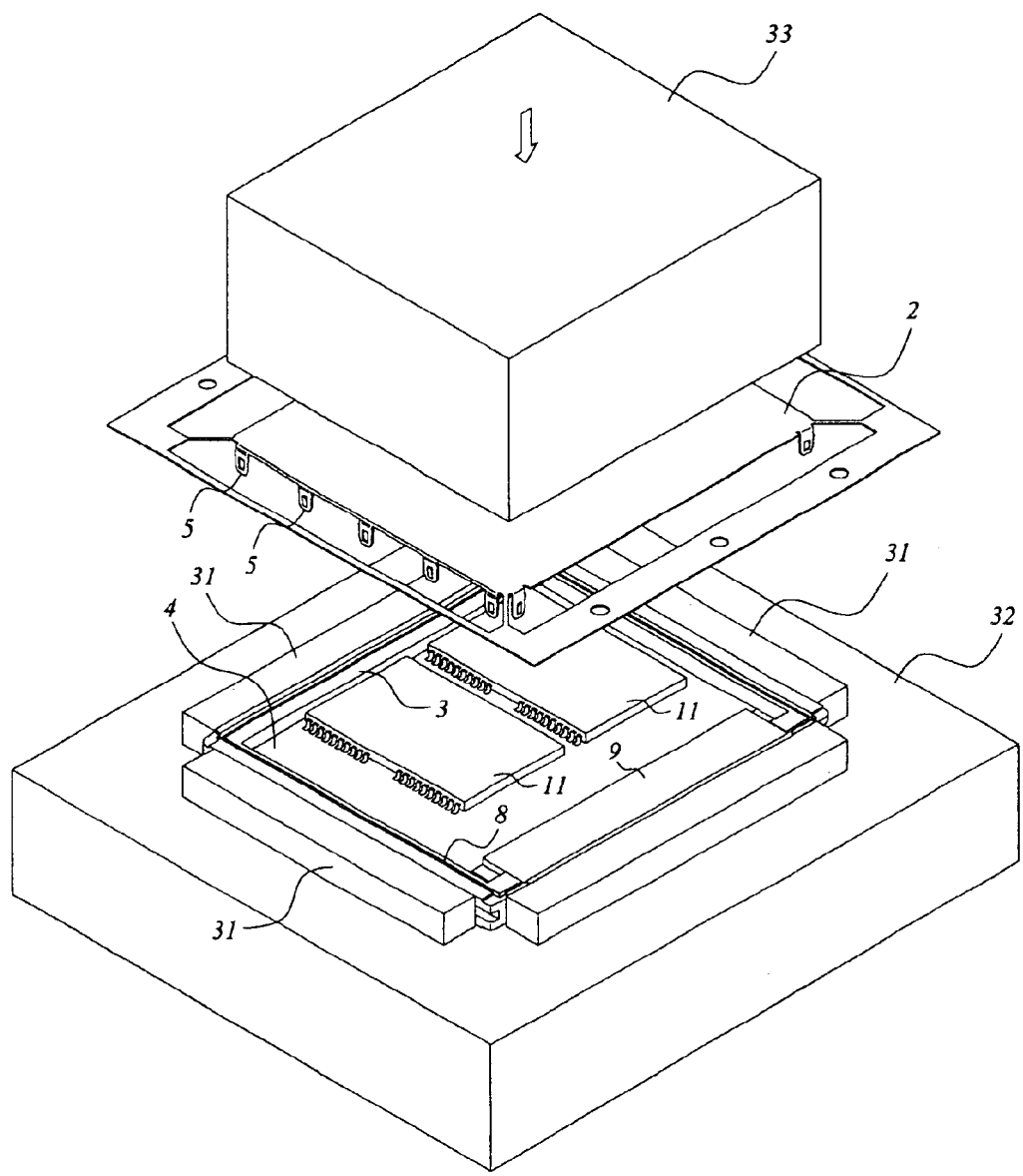
FIG. 18 is a plan view illustrating a method of manufacturing a semiconductor device according to an embodiment of the present invention.

Next, as shown in FIG. 18, the other panel plate 2 is attached to the surface of an opposite side of the frame 3 with using the jig shown in FIG. 13, or the like.

Figure 19A:
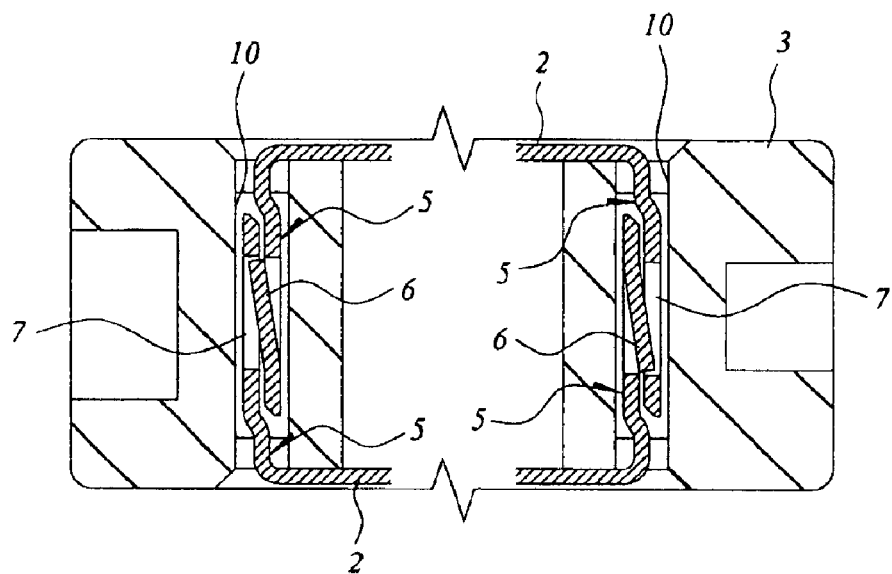
FIG. 19A is a cross-sectional view illustrating a method of manufacturing a semiconductor device that is an embodiment of the present invention.
Figure 19B:
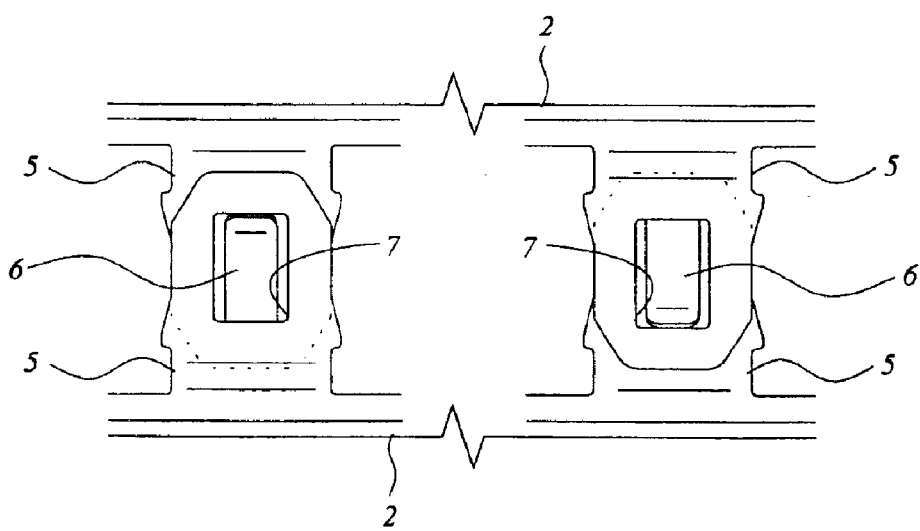
FIG. 19B is a front view.

FIG. 19A is a cross-sectional view showing a engaging state of the two panel plates 2 and 2 attached to the frame 3, and FIG. 19B is a front view showing the same.

The panel plates 2 and 2 are attached by using the above-described pushing jig, that is, by: pressing the engaging parts 5 and 5 of the panel plates 2 and 2 into the through holes 10 of the frame 3 from above and below; and inserting the lances 6 of the engaging parts 5 of one panel plate 2 into the corresponding holes 7 of the engaging parts 5 of the other panel plate 2.

As shown in the drawings, the engaging parts 5 are bent so that each lance 6 thereof can be located at an inner position and each hole 7 thereof can be located at an outer position. Therefore, there occur no gaps between the engaging parts 5 and the inner walls of the through holes 10. Thus, the lances 6 is easily inserted into the holes 7 by simply pressing the engaging parts 5 and 5 of the panel plates 2 and 2 into the through holes 10, and once the lances 6 are inserted into the holes 7, the panel plates 2 and 2 are not detached from each other even if pulled from the outside.

Also, in each of the panel plates 2 and 2, the engaging parts 5 each having the lance 6 and the engaging parts 5 each having the holes 7 are alternately arranged, and the number of the lances 6 and that of the holes 7 are equal to each other in the respective panel plates 2 and 2. Therefore, it is possible to evenly press the engaging parts 5 and 5 of the panel plates 2 and 2 thereinto.

As described above, the CF card 1 according to this embodiment has characteristics of the fact that the panel plates having once been assembled are extremely difficult to disassemble because the panel plates 2 and 2 have a rigidly engaging structure, and that high security is obtained because the engaging parts 5 are significantly deformed when the panel plates 2 are forcibly and strongly pulled from the outside and because traces caused by the pull are inevitably left.

Also, the CF card 1 according to this embodiment has characteristics of the fact that since the rigidly engaging structure is obtained by simply pressing the engaging parts 5 and 5 of the two panel plates 2 and 2 into the through holes 10 of the frame 3 with using the simple pushing jig, special apparatus such as an ultrasonic welding machine or the like is not required and it is possible to reduce the cost of the equipment investment for the assembly.

Figure 20:
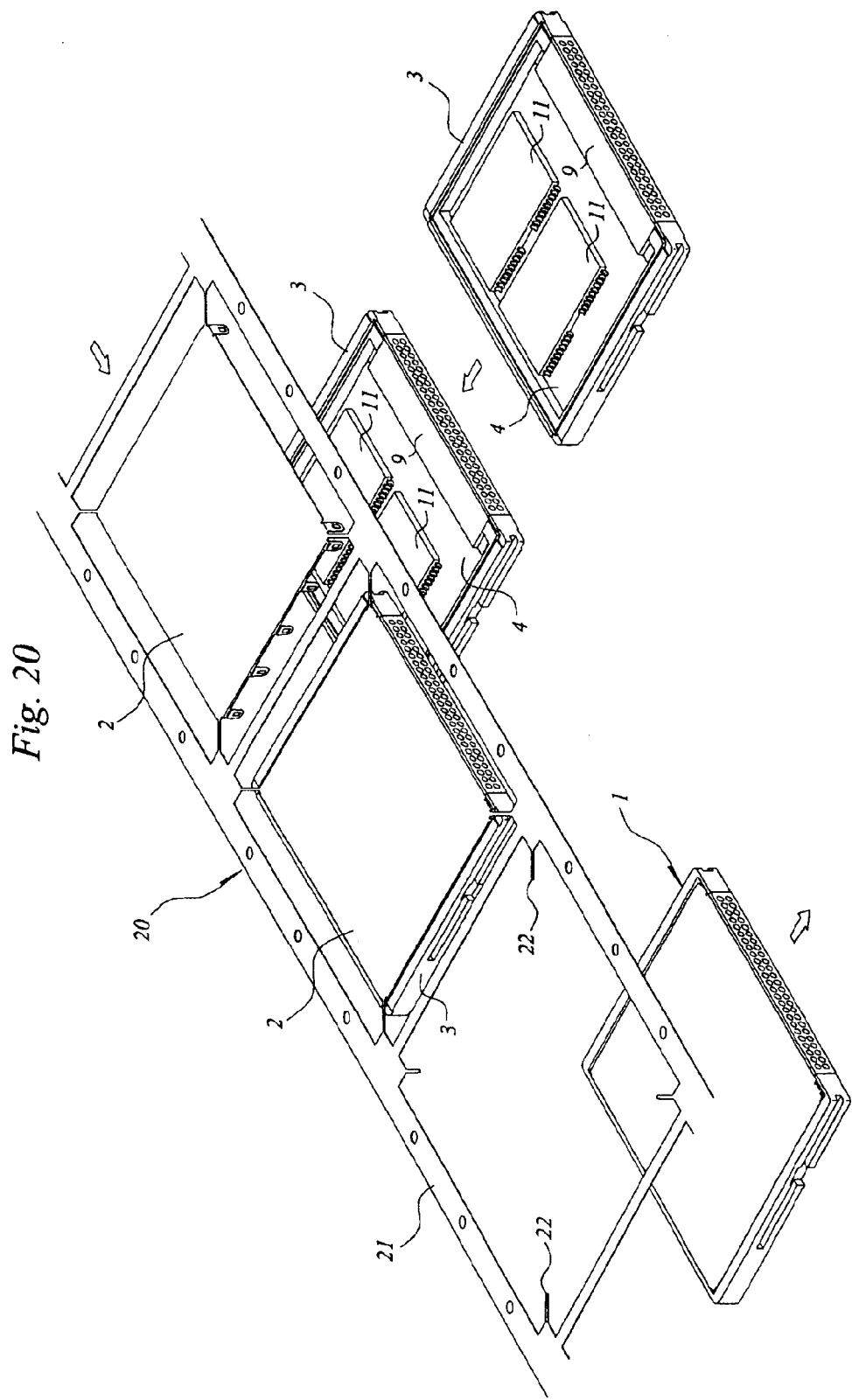
FIG. 20 is a plan view illustrating a method of manufacturing a semiconductor device that is an embodiment of the present invention.

As shown in FIG. 20, after the first panel plate 2 is inserted into the frame 3, the second panel plate 2 can also be inserted thereinto before each panel plate 2 is separated from the hoop material 20.

In this case, the frame 3 in which the first panel plate 2 has been inserted is first carried to a right-hand stage, and then the second panel plate 2 is inserted into the frame in which the first panel plate 2 has been inserted. Thereafter, the frame 3 is lifted by the carrier 21 and carried to a left-hand stage, and then the second panel plate 2 is separated from the carrier 21 by cutting the notches 22. It is also possible that the hoop material 20 together with the frame 3 is wound on a reel after the insertion of the second panel plate 2 into the frame 3 at the right-hand stage, and then is delivered to a maker, and, at the time, the second panel plate 2 is separated from the carrier 21.

Thus, the automation of the assembly can be easily attained in various manners by forming a multiply series of the panel plates 2. Therefore, the reduction in the assembly cost and in the lead time can be achieved.

In the foregoing, the inventions made by the inventors thereof have been described in detail based on the embodiments. However, needless to say, the present invention is not limited to the above-mentioned embodiments, and can be variously changed and modified without departing from the gist thereof.

In the foregoing embodiments, the case where the present invention is applied to the CF card type-I has been described. However, needless to say, the present invention can be applied to the CF card type-II having a casing with a thickness of 5 mm. Further, the engagement structure of the panel plates according to the present invention can be applied not only to the CF card in which the interface of the connector has sixty-eight pins but also to various memory cards such as a PC card or the like.

INDUSTRIAL APPLICABILITY

The semiconductor device according to the present invention is constituted by a small number of components and so can be assembled simply. Therefore, by applying to the memory card connected to various electronic equipments such as a digital camera, a handheld PC, an audio recorder and the like, the manufacturing cost thereof can be reduced.

What is claimed is:

1. A method of manufacturing a semiconductor device comprising the steps of:

(a) providing a first serial hoop material with a plurality of first panel plates arranged serially in one direction and a second serial hoop material having a plurality of second panel plates arranged serially in said one direction, each of said pluralities of first and second panel plates being coupled to said first and second serial hoop material respectively by linking parts and having a plurality of protruding parts at peripheral sides thereof;

(b) providing a plurality of frame bodies each having a plurality of through holes penetrating through upper and rear surfaces of said plurality of frame bodies;

(c) providing a plurality of substrates each having a semiconductor package mounted thereon;

(d) attaching said plurality of frame bodies to said first serial hoop material such that said protruding parts of said plurality of first panel plates are inserted in said plurality of through holes of said plurality of frame bodies respectively, thereby to form a plurality of cavities defined by said plurality of first panel plates and said plurality of frame bodies;

(e) attaching said plurality of substrates on said plurality of cavities defined by said plurality of first panel plates and said plurality of frame bodies;

(f) after step (e), disposing said second serial hoop material over said first aerial hoop material such that said pluralities of serially-arranged first and second panel plates overlap each other in said one direction, and such that said plurality of substrates are positioned between said pluralities of serially-arranged first and second panel plates;

(g) after step (f), attaching said plurality of second panel plates to corresponding ones of said plurality of frame bodies such that said protruding parts of said plurality of second panel plates are inserted in said plurality of through holes of said plurality of frame bodies, and such that said plurality of substrates having said semiconductor packages are covered by said plurality of second panel plates; and (h) after step (g), cutting said linking parts of said first and second hoop materials, thereby providing a plurality of semiconductor devices each having one of said first panel plates, one of said second panel plates, one of said substrates with one of said semiconductor packages, and one of said frame bodies.

2. A method of manufacturing a semiconductor device according to claim 1, wherein said linking parts are disposed at four corners of each of said serially-arranged first and second panel plates.

3. A method of manufacturing a semiconductor device according to claim 1, wherein said first and second hoop materials with said pluralities of serially-arranged first and second panel plates are formed of a stainless steel, and said plurality of frame bodies are formed of a resin.

4. A method of manufacturing a semiconductor device according to claim 3, wherein each of said plurality of semiconductor devices is an IC card.

* * * * *